United States Patent [19]

Miller, Jr.

[11] Patent Number: 4,595,884

[45] Date of Patent: Jun. 17, 1986

[54] TRANSDUCER AMPLIFIER AND METHOD

[75] Inventor: Edward J. Miller, Jr., Tempe, Ariz.

[73] Assignee: Tobar, Inc., Tempe, Ariz.

[21] Appl. No.: 662,705

[22] Filed: Oct. 19, 1984

[51] Int. Cl.$^4$ .......................... H03F 3/45; H03F 3/68
[52] U.S. Cl. .................................... 330/258; 330/116;
                                              330/146; 330/311
[58] Field of Search ............... 330/116, 146, 252, 258,
                                              330/289, 311, 310

[56] References Cited

U.S. PATENT DOCUMENTS 3,629,719 12/1971 Heller ................................. 330/116
4,138,641 2/1979 Karlin et al. ..................... 330/258 X
4,490,686 12/1984 Dimeff ................................ 330/258

OTHER PUBLICATIONS

"Operational Amplifiers, Design and Applications," Burr-Brown, 1971, Part 2, Section 6, pp. 201-207.

Primary Examiner—Eugene R. LaRoche
Assistant Examiner—Steven J. Mottola
Attorney, Agent, or Firm—Cahill, Sutton & Thomas

[57] ABSTRACT

An improved transducer amplifier includes a first operational amplifier having low drift of its input offset voltage characteristic and having a first output of a transducer connected to its positive input and a second output of the transducer connected by means of an input resistor to its negative input. The gain of the first operational amplifier is set by a feedback resistor. A second operational amplifier having low current drain is connected as a voltage follower with its input connected to the first transducer output. A differential signal produced between the voltage follower output and the output of the first operational amplifier is applied to a conventional differential to single ended converter circuit with precisely matched input and feedback resistors to eliminate the common mode voltage component of the differential signal and to reference an amplified error signal component of the differential signal to ground. The improved transducer amplifier provides the same common mode rejection and lower input offset voltage drift with lower total current drain and lower cost than conventional instrumentation amplifiers.

6 Claims, 3 Drawing Figures

TRANSDUCER AMPLIFIER AND METHOD

BACKGROUND OF THE INVENTION

The invention relates to transducer amplifiers, and especially to transducer amplifiers that have at least as high common mode rejection as prior art transducer amplifiers, but have lower current drain and are less expensive.

Pressure transducers are commonly implemented by depositing strain sensitive resistance elements on a measurement diaphragm. Typically, the deposited strain sensitive resistors are connected in a Wheatstone bridge in such a fashion that one pair of resistors is put in compression and the other pair in tension as pressure is applied to the diaphragm, causing deformation thereof. Typically, two opposing corners of the bridge are connected to a DC voltage source, and the remaining corners produce the output signal of the Wheatstone bridge. The output signal includes a common mode voltage component produced by voltage division across the resistors when no pressure is applied to the transducer and an error signal component the amplitude of which is proportional to the resistance changes produced in the deposited resistors as the diaphragm is deformed due to application of pressure thereto. The common mode voltage component may be a number of volts, while the small signal or error component may be in the range from 1 to 20 millivolts, for permissible stress levels. Typically, the value of the common mode signal is not of interest, and only an amplified version of the error signal referenced to ground is desired. This presents the design engineer with the problem of how to amplify the error signals to produce the amplified error signal referenced to ground with adequate accuracy, minimum current drain and at minimum cost. These objectives can not be accomplished by using a simple differential input amplifier, as this approach will result in poor common mode rejection. Furthermore, such a circuit is unacceptably sensitive to thermal drift of the input offset voltage of the differential amplifier.

Therefore, instrumentation amplifiers, such as the one described in FIG. 6.5 of "Operational Amplifiers—Design and Applications" by Graeme, Huelsman, and Tobey, McGraw Hill, 1971 (incorporated herein by reference) have been used. (Those skilled in the art know that any amplifier that is connected to the output conductors of a transducer bridge has to have very low drift of its input offset voltage, so that large input offset errors will not be multiplied by the gain of that amplifier or subsequent amplifiers.) This "classical" instrumentation amplifier requires two precision, low drift operational amplifiers each having its positive input connected to one output terminal of the bridge, and each having a feedback resistor connected between its output and its negative input, and each having its negative inputs coupled together by a gain adjustment potentiometer. The differential output signal produced between two outputs of the operational amplifiers then is converted from a differential signal to a single ended output signal (i.e., a signal referenced to ground) by a typical differential to single ended output converter circuit of the type well known to those skilled in the art. Although the foregoing instrumentation amplifier circuit is widely used, it requires two costly high precision low drift operational amplifiers, rather than one, almost doubling the cost of this circuit over that required if only a single high precision, low drift operational amplifier could be used. Furthermore, such high cost, low drift operational or differential amplifiers all have relatively high current drain at the present state of the art, compared to cheaper, low current operational amplifiers that are readily available. High precision, low drift operational amplifiers typically have current drains of one to two milliamperes, whereas low cost low current operational amplifiers typically have only about ten to one hundred microamperes of current drain.

It is important to users of transducer amplifiers that they be able to conveniently change or "scale down" the calibration ranges of transducer amplifiers in accordance with large changes in the pressures or other parameters being measured by a transducer. For such scaling down to be accurate, it is essential that the drift of the input offset voltage be as low as possible.

It is also important that it be convenient to adjust a "zero point" of the output signal produced by a transducer amplifier to cause it to correspond to a desired point of the transducer output signal range. For classical instrumentation amplifiers, this has to be done by zero adjustment bias circuity connected either to the transducer bridge output, which causes undesireable bridge loading problems, or to the output of the transducer amplifier, which sometimes is difficult because of the available ground and power supply voltage values.

Thus, there remains an unmet need for a lower cost, lower current drain transducer output amplifier circuit that has performance at least as good, especially with respect to high common mode rejection, as the classical instrumentation amplifier that is almost universally used for this purpose, and also has as low input offset voltage drift as is practical, and also has its zero point easily adjusted.

SUMMARY OF THE INVENTION

Accordingly, it is an object of the invention to provide an improved amplifier having common mode rejection at least as high as classical instrumentation amplifiers, but having substantially lower current drain.

Another object of the invention is to provide an improved transducer amplifier having high common mode rejection and inexpensively implemented using fewer high cost, low drift amplifiers than are required in a classical instrumentation amplifier.

Another object of the invention is to provide an improved transducer amplifier having substantially lower input offset drift than classical instrumentation amplifiers.

Another object of the invention is to provide a transducer amplifier that has a zero point adjustment bias circuit connected elsewhere than at an input or output of the transducer amplifier.

Briefly described, and in accordance with one embodiment thereof, the invention provides an improved transducer amplifier including only one amplifier of the type having highly stable thermal drift characteristics, one input of the amplifier being connected to a first output terminal of a transducer bridge, the other input of that amplifier being coupled by a feedback resistor to the output of the amplifier and by an input resistor to a second output terminal of the transducer bridge, thereby producing a differential output signal including the common mode voltage component of the transducer output signal and an error signal component equal to the gain of the operational amplifier multiplied by the error signal component produced by the transducer bridge. The differential output signal is applied to the inputs of a differential to single ended converter circuit to eliminate the common mode component of the differential output signal. In one described presently preferred embodiment of the invention, a voltage follower circuit is coupled between the first output terminal of the transducer bridge and one input of the differential to single ended converter circuit to greatly reduce resistive loading on the transducer bridge. The voltage follower is implemented using a low cost, low current operational amplifier.

In another described embodiment of the invention, a zero suppression/elevation circuit is connected to the summing junction between the feedback resistor and the input resistor of the amplifier to produce an additive or subtractive bias current, which performs the function of offsetting the transducer amplifier output signal with respect to the transducer bridge output signal.

In the described embodiments of the invention, the amplifier is a precision, low drift operational amplifier, such as a chopper stabilized operational amplifier. The differential to single ended converter circuit is implemented using a low cost, low current operational amplifier and four precisely matched resistors.

DESCRIPTION OF THE INVENTION

Figure 1:
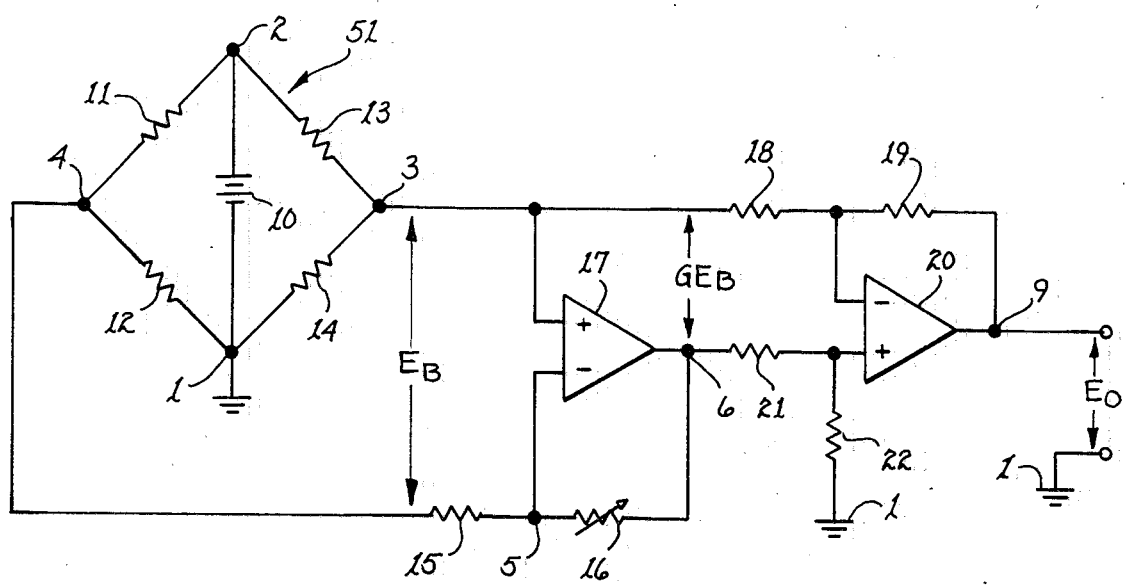
FIG. 1 is a schematic diagram of a basic embodiment of the present invention.

Referring now to FIG. 1, the illustrated circuit includes a transducer bridge 51 which generates a voltage $E_B$. The voltage $E_B$ includes a relatively large common mode voltage component (which may be several volts or more) due to the dc biasing of the bridge 51 and a relatively small error signal component (which may be in the range from less than 1 millivolts to 20 millivolts) produced by variations in the transducer bridge currents. The signal $E_B$ is applied as an input to an amplifier circuit 50 constructed in accordance with the present invention.

Bridge circuit 51 is a Wheatstone bridge including resistor 11 connected between conductors 2 and 4, resistor 13 connected between conductors 2 and 3, resistor 14 connected between conductor 3 and ground conductor 1, and resistor 12 connected between conductors 1 and 4. Typically, resistors 11, 12, 13 and 14 might be strain-sensitive resistors deposited on a diaphragm in such a fashion that two of them, for example resistors 11 and 14, are in tension while the other two resistors are in compression during deformation of the diaphragm. A source of power or bridge bias voltage, designated by reference numeral 10, is connected between ground conductor 1 and conductor 2

Amplifier circuit 50 includes a highly stable operational amplifier 17 having its positive input connected to conductor 3 and its negative input connected by means of conductor 5 and resistor 15 to conductor 4 of Wheatsone bridge 51. Operational amplifier 17 is a precision, low drift operational amplifier that is highly stable in the sense that its operating parameters, especially its input offset voltage, do not drift significantly with time or as its temperature changes.

The output of operational amplifier 17 is produced on conductor 6, and is fed back by potentiometer 16 to conductor 5. The differential output voltage produced by operational amplifier 17 between conductor 6 and conductor 3 is represented by the expression $G \cdot E_B$, wherein G is equal to $-R_{16}/R_{15}$, $R_{15}$ and $R_{16}$ being the resistances of resistors 15 and 16, respectively. The amplified error signal $G \cdot E_B$ is a differential signal having the same common mode voltage component as $E_B$.

In order to eliminate the common mode component, a conventional differential to single ended converter circuit including operational amplifier 20 and resistors 18, 19, 21 and 22 receives the signal $G \cdot E_B$. Resistor 18 is connected between conductor 3 and the negative input of operational amplifier 20. Feedback resistor 19, which is precisely matched to resistor 18, is connected between negative input of operational amplifier 20 and conductor 9, the latter conductor being connected to the output of operational amplifier 20. Resistor 21 is connected between conductor 6 and the positive input of operational amplifier 20. Resistor 22 is connected between the positive input of operational amplifier 20 and ground conductor 1. If resistors 18, 19, 21 and 22 are precisely matched, the output signal $E_0$ between conductor 9 and ground conductor 1 will, of course, be referenced to ground, and will have no common mode voltage component.

Figure 2:
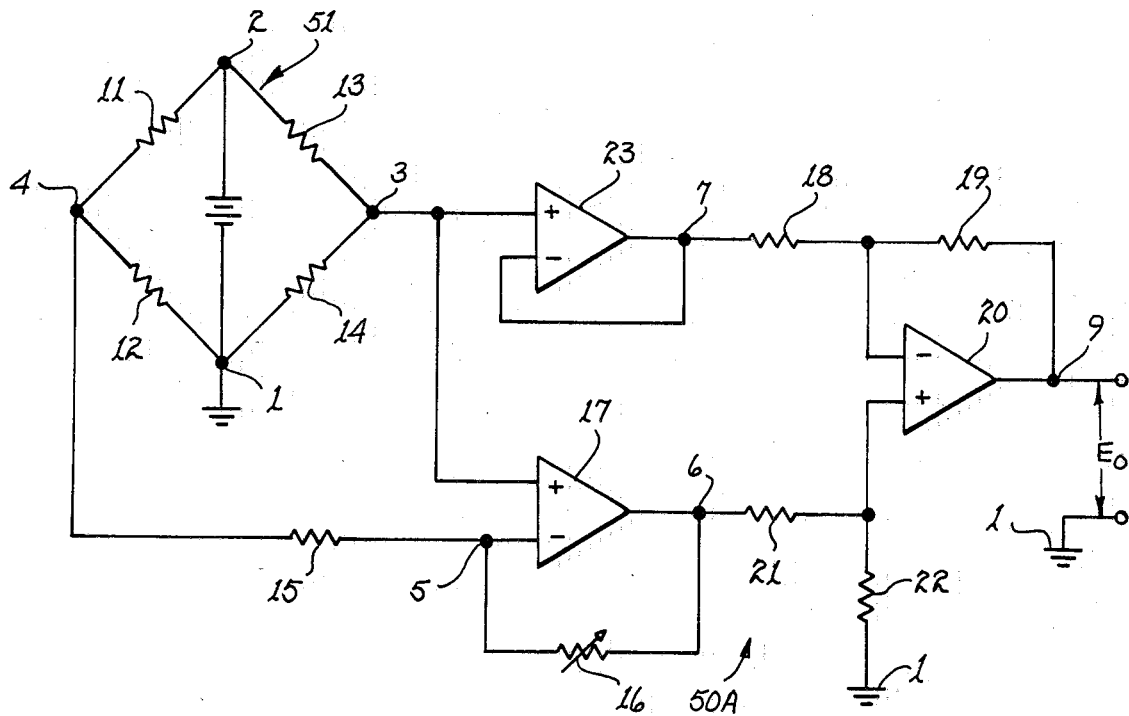
FIG. 2 is a schematic circuit diagram of an improved embodiment of the invention.

An improved version of the amplifier circuit 50 is designated by reference numeral 50A in FIG. 2. Amplifier circuit 50A is identical to amplifier circuit 50, except that an additional low cost, low current operational amplifier 23, connected as a voltage follower, is inserted between conductor 3 and conductor 7, conductor 7 being connected to one terminal of resistor 18. The positive input of operational amplifier 23 is connected to conductor 3. The output of operational amplifier 23 is connected back to the negative input thereof. Note that since operational amplifier 17, rather than operational amplifier 23, provides amplification of the error voltage, operational amplifier 23 need not have low drift of its input offset voltage characteristic, and therefore can be very inexpensive. (Those skilled in the art know that low drift operational amplifiers are far more expensive then those having more relaxed thermal drift characteristics.)

Figure 3:
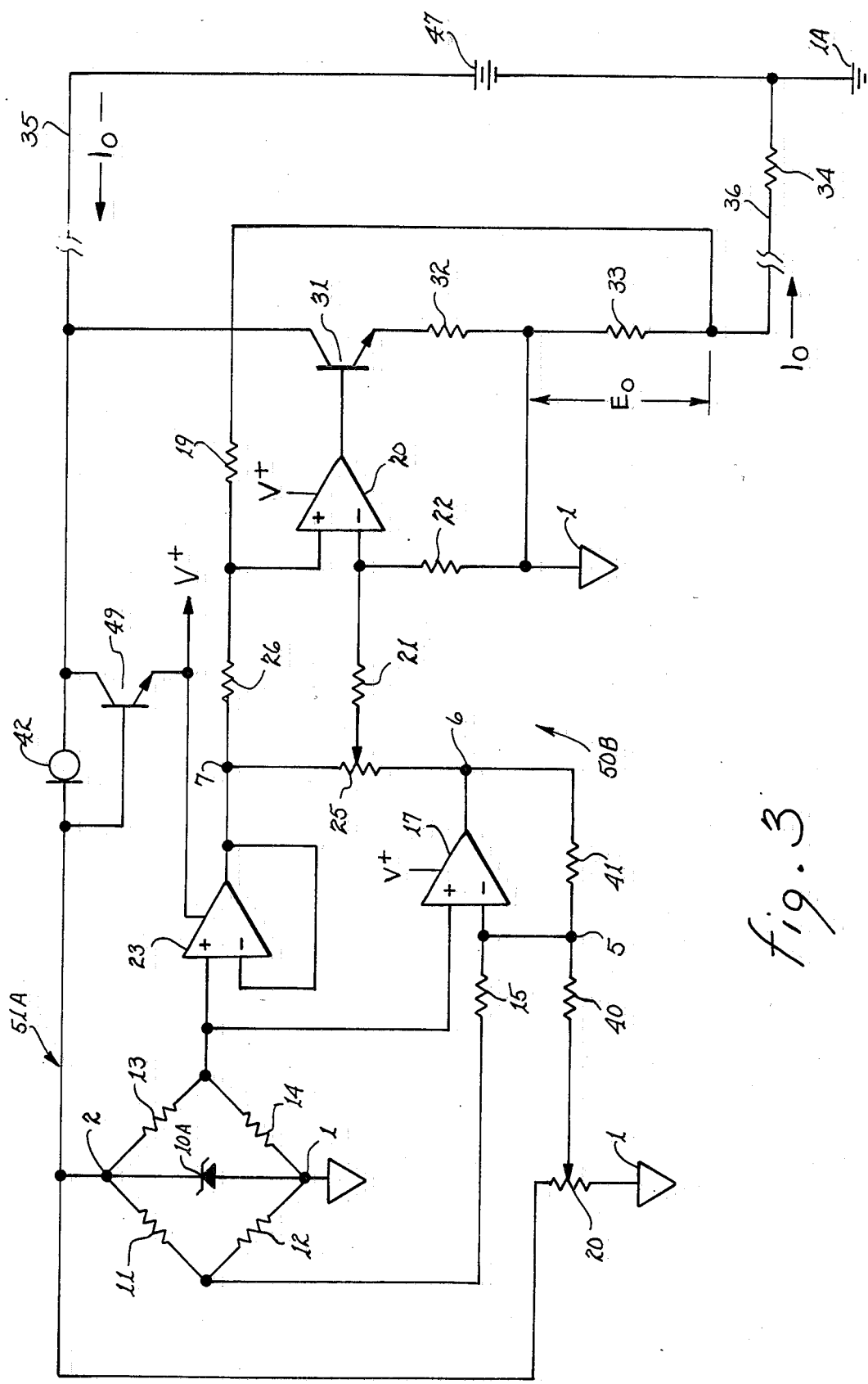
FIG. 3 is a schematic circuit diagram of another embodiment of the invention.

In the embodiment of FIG. 3, a slightly modified Wheatstone bridge 51A is shown, in which conductor 1 is a floating ground conductor. The power applied across terminals 1 and 2 of the Wheatstone bridge 51A is regulated by a zener diode 10A and a current limiter. Current limiter 42 can be a current limiting field effect transistor "diode" (for example, a Siliconix CR220 current limiter). A regulating NPN transistor 49, produces a regulated supply voltage V+ at its emitter. A remote power source 47 connected between ground conductor 1A and conductor 35 is connected to the collector of transistor 49 and to the anode of current limiter diode 42.

A potentiometer 25 is connected between conductors 6 and 7 and has a tap connected to one terminal of resistor 21. Resistor 21 is connected, as before, to the negative input of operational amplifier 20. The output of operational amplifier 20 is connected to the base of an NPN transistor 31. The collector of transistor 31 is connected to conductor 35. The emitter of transistor 31 is coupled by resistor 32 to conductor 1, as in FIG. 2. A resistor 33 is connected between floating ground conductor 1 and conductor 36. Conductor 36 is connected by resistor 34 to ground conductor 1A. The other features of FIG. 3 are essentially the same as in FIG. 2. The three operational amplifiers 17, 20 and 23 are all powered by the regulated voltage V+ produced by regulating transistor 49.

A zero suppression/elevation network connected to summing conductor 5 includes a resistor 40 connected between conductor 5 and the tap of variable resistor 20. Resistor 20 is connected between conductor 2 and conductor 1.

At this point, it should be noted that the embodiment of the invention most useful to the present assignee is the embodiment of FIG. 3, wherein the bridge 51A and amplifier circuit 50B comprise a unit referred to as a "field transmitter". The field transmitter is connected by means of a two wire transmission line comprising conductors 35 and 36, and can be up to a mile in length. The power supply 47, resistor 34, and ground conductor 1A typically are located at a control center or in a control room remote from the transducers. The transducers typically are located at various sites in a manufacturing process factory to measure fluid pressures, flow rates, etc. Resistor 34 is a "signal developing resistor".

The range of values of the current $I_0$ through the current loop comprised of conductors 35 and 36 is four to twenty milliamperes, so the entire field transmitter must be able to operate on less than four milliamperes under all conditions. Since operational amplifier 20 is incapable of supplying currents of this magnitude, the base of NPN transistor 31 is driven by the output of operational amplifier 20 to provide the needed current drive capability. The voltage $E_0$ of the embodiments of FIGS. 1 and 2 is developed across resistor 33 to convert the output voltage $E_0$ to the return current $I_0$. Consequently, the voltage on conductor 36 is negative relative to the floating ground conductor 1. Therefore, the feedback resistor 19 is connected to the positive, rather than the negative input of operational amplifier 20, and the negative input thereof is connected to input resistors 21 and 22. (This is the reverse of the corresponding connections in FIGS. 1 and 2.)

As a practical matter, the feedback resistor 41 in FIG. 3 is too high in value to be available as a wire-wound potentiometer. Therefore, potentiometer 25 is used instead to adjust the gain of the amplifier 50B. (Wire-wound potentiometers in the 50 to 100 killohm range are readily available.)

The operation of the circuits described above is very simple. In FIG. 1, the common mode component of the transducer output appears on conductor 3, and, with the transducer error signal, is applied to the differential to single ended converter circuit including operational amplifier 20 and resistors 18, 19, 21 and 22. The circuit including operational amplifier 17 and resistors 15 and 16 multiplies the error component of the transducer output signal by the gain determined by resistors 15 and 16 (i.e., by $-R_{16}/R_{15}$), and superimposes the amplified error signal on the common mode signal and applies the resulting voltage to conductor 6.

Those skilled in the art know that all of the resistors 18, 19, 21 and 22 of the differential to single ended converter circuit must be properly matched, for example, to within one percent, or else the common mode voltage appearing on conductors 3 and 6 will not be adequately attenuated. (Those skilled in the art know that any mismatching between resistors 18, 19, 21 and 22 will cause the output $E_0$ to be a function of the common mode voltage component of the transducer bridge output, which, of course, is highly undesireable.) The error component between conductors 3 and 6 will be multiplied by $-1$.

The only difference between the operation of the circuits of FIGS. 1 and 2 is that the voltage follower comprised of operational amplifier 23 reduces the resistive loading on conductor 3 of the Wheatstone bridge by presenting to it an impedance that is many orders of magnitude higher than the impedance of resistor 18.

Typically, highly stable, precision low drift operational amplifiers, such as ICL 7650 chopper-stablized operational amplifiers (manufactured by Intersil) or other commercially available high precision, low drift operational amplifiers must be utilized in the above-mentioned classical instrumentation amplifiers. Such operational amplifiers typically cost from $6.00 to $8.00 apiece. Ordinary low cost, low current amplifiers such as the Texas Instruments TL081 or ICL 7511 operational amplifiers, costing less than $1.00, can be used to implement operational amplifiers 20 and 23. Typically, the current drain of the power supply for the transducer bridge might be approximately two milliamperes. The current drains of the low cost operational amplifiers such as the ones that can be used to implement operational amplifiers 20 and 23, are very low, typically ten to one hundred microamperes. However, the high precision low drift operational amplifiers such as the ICL 7650 typically have one to two milliamperes current drain. In many applications, the current drain necessitated by use of the classical instrumentation amplifier described above is unacceptable. The circuit of the present invention substantially reduces the total current drain by eliminating the need for one of the high precision low drift, high current drain operational amplifiers.

Exemplary values for resistors 15, 16, and 18 are 10 kilohms, 1 megohm, and 100 kilohms, respectively. Resistors 19, 21 and 22 have resistances equal to the resistance of resistor 18.

A novel feature of each of the above described amplifier circuits of the present invention is that instead of applying the signals on Wheatstone bridge conductors 3 and 4 to two separate high precision, low drift differential or operational amplifiers, the output signal of the Wheatstone bridge is applied directly between the positive and negative inputs of a single highly stable operational amplifier 17. Operational amplifier 17 presents high impedance to both output terminals of the Wheatstone bridge and also provides a high, adjustable level of gain for amplifying the error component of the bridge output signal.

As indicated above, this novel feature of applying both transducer outputs to a single low drift operational amplifier eliminates one high cost operational amplifier of the closest prior art instrumentation amplifier circuits. The amplifier circuit of the present invention thereby provides the same functions of providing low loading to the bridge terminals and providing as much gain as is needed at only approximately half of the cost required for the classical instrumentation amplifiers, and requires only approximately half of the current drain of a classical instrumentation amplifier. Furthermore, the amplifier circuit of the present invention has only one half of the net input offset drift of a classical instrumentation amplifier, since the drifts of the input offset voltages of the two low drift operational amplifiers of the classical instrumentation amplifier are additive algebraically.

This advantage of lower drift of the transducer amplifiers of the present invention is very important to users of field transmitters, such as the one shown in FIG. 3. This is because a typical field transmitter has a "full range output". For purposes of illustration, assume that the transducer is one that receives forces up to 100 pounds of pressure. Forces in this range, produced in response to the process being monitored, cause deformation of the transducer and produce variations in the transducer output voltage. The transducer amplifier responds to the transducer output to produce an output current in the range from four milliamperes to twenty milliamperes and transmits it through the transmission line 35, 36 in FIG. 3 to the voltage developing resistor 34, across which a voltage is developed that then is sensed by appropriate circuitry.

It is very convenient to a user of the field transmitters to be able to use the same field transmitter unit to monitor pressures in a completely different range than the 100 pound range mentioned in the example above, for example, in a 25 pound pressure range. Effective use of the field transmitter in the latter range would simply require recalibration of the field transmitter, rather than use of a different one. The transducer amplifier has zero adjustments and range or span adjustements that allow the user to "scale down" or "turn down" the 100 pound range by a factor of 4 to 1 to make the same field transmitter, in effect, a "25 pound" field transmitter instead of a "100 pound" one. In the field transmitter of FIG. 3, the zero adjustment is accomplished by means of potentiometer 20, and the down scaling of the range is accomplished by adjustment of potentiometer 25. The zero adjustment sets the output voltage $E_0$ or the output current $I_0$ to a value corresponding to a desired "zero point" (i.e., the bottom value of a selected range of values) of the pressure applied to the transducer.

Present state-of-the-art transducers are manufactured to provide four-to-one or five-to-one "turn down" or scale down range capability. However, the transducer amplifier of FIG. 3 can be "turned down" or scaled down by a ratio of fifteen-to-one. This is very advantageous to a customer, because even if he has a large range of applications for the transducer, he does not need to stock a large variety of different types of field transmitters, because the one of the present invention can be adjusted to meet all of his range of needs. Therefore the number of field transmitters to be inventoried by the customer is greatly reduced. Since the transducer and transducer amplifier constituting a field transmitter typically cost $600.00 to $1,000.00, the need to keep the "on hand" supply of field transmitters as low as possible is obvious.

With this background, it should be appreciated that any high drift of the input offset voltage of the transducer amplifier results in inaccuracies which greatly limit the extent to which a particular field transmitter can be turned down or scaled down in the manner described above. Thus, the fact that the drift of the input offset voltage of the transducer amplifier of the present invention is only one half that of an equivalent classical instrumentation amplifier is that a greater degree (i.e., fifteen-to-one) of scaling down of the range is achieved.

Thus, as a practical matter, the decreasing of the thermal drift of the transducer amplifier of the present invention by a factor of two results in increasing the scale down capability of the transducer amplifier by a factor of two over what is possible with the same accuracy if a classical instrumentation amplifier is used as a transducer amplifier.

Another way in which a large turn down or scale down range is advantageous to the user of a transducer field transmitter unit is that a wide scale down range enables the user to leave a particular field transmitter in place, and nevertheless measure a wide range of pressures caused by fluid flows through pipes, for a wide range of different flows which may be required under different plant operating conditions. It would be very inconvenient for the user to have to occasionally change field transmitters just because the present flow rate falls outside of the range of accurate scale down capability of the transducer amplifier.

One advantage of the circuit configurations shown in FIGS. 2 and 3 is that summing conductor 5 is available to allow simple implementation of a zero suppression/elevation circuit, for example by means of the potentiometer 20 and bias resistor 40 from a node within the amplifier.

Bridges used in transducers often require large amounts of zero elevation or zero suppression, which now is easily supplied in the transducer amplifier of the present invention by the potentiometer 20 and bias resistor 40 connected to summing node 5.

It should be noted that the term "differential amplifier" as used in the claims is intended to encompass all amplifier circuits including two inputs for receiving a differential input signal, including operational amplifiers.

While the invention has been described with reference to several particular embodiments thereof, those skilled in the art will be able to make various modifications to the described embodiments of the invention without departing from the true spirit and scope thereof. It is intended that all variations of the disclosed elements and steps which are equivalent to those disclosed in that they perform substantially the same function and substantially the same way to accomplish substantially the same result are encompassed by the invention. For example, the circuits described can operate in the microvolt regions, below the indicated one-to-twenty millivolt region. The input resistor 15 could be omitted in some cases, and its function could be performed by resistance in the transducer bridge.

I claim:

1. An improved transducer amplifier circuit comprising in combination:
    (a) a bridge circuit including a first strain-sensitive resistor connected between a first conductor and a second conductor, a second strain-sensitive resistor connected between the first conductor and a third conductor, a third strain-sensitive resistor connected between the second conductor and a ground conductor, and a fourth strain-sensitive resistor connected between the ground conductor and the third conductor, and a power source connected to the first conductor, the bridge circuit producing a differential signal between the second and third conductors including a relatively large common mode voltage component, and a relatively small error voltage component;
    (b) a first operational amplifier having an output, a first input coupled to the third conductor, a second input coupled to the second conductor by a first resistor and to the output by a second resistor, for producing a first voltage difference between the third conductor and the output, the first voltage difference being equal to the gain of the first operational amplifier multiplied by the error voltage component;

(c) a voltage follower circuit including a second operational amplifier having an output, a first input connected to the third conductor, and second input connected to the output of the second operational amplifier;

(d) differential to single ended converting circuit means responsive to the first voltage difference for eliminating a common mode voltage component from the first voltage difference to produce an output signal equal to the gain of the differential to single ended converting circuit means multiplied by the first voltage difference, the differential to single ended converting circuit means including a second operational amplifier having an output, a first input coupled to that output by a third resistor and to the output of the third operational amplifier by a fourth resistor, the third operational amplifier having a second input;

(e) a fifth resistor coupling the second input of the third operational amplifier to the output of the first operational amplifier and a sixth resistor coupling the second input of the third operational amplifier to the ground conductor, the voltage follower circuit effectively insulating the bridge circuit from significant loading by the differential to single ended converting circuit means.

2. The improved transducer amplifier circuit of claim 1 wherein the relatively small error voltage component is within the range from approximately one millivolt to 20 millivolts.

3. The improved transducer amplifier circuit of claim 1 wherein the relatively small error voltage component is less than approximately one millivolt.

4. A field transmitter amplifier circuit comprising in combination:

(a) a bridge circuit including a first strain-sensitive resistor connected between a first conductor and a second conductor, a second strain-sensitive resistor connected between the first conductor and a third conductor, a third strain-sensitive resistor connected between the second conductor and a floating ground conductor, and a fourth strain sensitive-resistor connected between the floating ground conductor and the third conductor;

(b) a high precision, low drift operational amplifier having an output connected to a fourth conductor, a positive input connected to the third conductor, and a negative input coupled by a first resistor to the second conductor, by a second resistor to the output, and by a third resistor to a tap of a first potentiometer;

(c) a relatively low precision second operational amplifier that dissipates substantially less power than the first operational amplifier, the second operational amplifier having an output, a positive input connected to the third conductor, and a negative input connected to the output of the second operational amplifier, the output of the second operational amplifier being connected to a fifth conductor;

(d) a differential to single ended converter circuit including a third operational amplifier having a positive input connected by a fourth resistor to the fifth conductor and by a fifth resistor to a sixth conductor, a negative input connected by a sixth resistor to the floating ground conductor and by a seventh resistor to a second potentiometer, and an output connected to the base of a first transistor having its emitter connected by an eighth resistor to the floating ground conductor, the second potentiometer being connected between the fourth and fifth conductors;

(e) a zero point adjustment network including the first potentiometer and means for coupling the first potentiometer between the first conductor and the floating ground conductor;

(f) a current limiter circuit connected between the first conductor and a seventh conductor for supplying current to the bridge circuit and for supplying base current to a second transistor having its collector connected to the seventh conductor, its base connected to the first conductor, and its emitter connected to positive power supply terminals of the first, second, and third operational amplifiers, the collector of the first transistor being connected to the seventh conductor, the seventh conductor also being connected to a first wire of a two wire transmission line, the first wire being connected to the positive terminal of a remote voltage source; and (g) a ninth resistor connected between the floating ground conductor and the second wire of the two wire transmission line, the second wire being connected at its remote end to a signal developing resistor.

5. The field effect transmitter amplifier circuit of claim 4 wherein the bridge circuit produces a differential signal between the second and third conductors including a relatively large common mode voltage component and a relatively small error voltage component in the range from approximately one millivolt to 20 millivolts.

6. The improved transducer amplifier circuit of claim 4 wherein the bridge circuit produces a differential signal between the second and third conductors including a relatively large common mode voltage component and a relatively small error voltage component that is less than approximately one millivolt.

* * * * *